United States Patent
Yamaguchi et al.

(10) Patent No.: US 7,803,282 B2
(45) Date of Patent: Sep. 28, 2010

(54) PIEZOELECTRIC/ELECTROSTRICTIVE BODY, MANUFACTURING METHOD OF THE SAME, AND PIEZOELECTRIC/ELECTROSTRICTIVE ELEMENT

(75) Inventors: Hirofumi Yamaguchi, Komaki (JP); Shuichi Ozawa, Nagoya (JP)

(73) Assignee: NGK Insulators, Ltd., Nagoya (JP)

( * ) Notice: Subject to any disclaimer, the term of this patent is extended or adjusted under 35 U.S.C. 154(b) by 494 days.

(21) Appl. No.: 11/844,560

(22) Filed: Aug. 24, 2007

(65) Prior Publication Data

US 2008/0054216 A1    Mar. 6, 2008

(30) Foreign Application Priority Data

Sep. 4, 2006  (JP)  ............... 2006-239147
Jul. 25, 2007  (JP)  ............... 2007-193962

(51) Int. Cl.
    *H01L 41/22*  (2006.01)
(52) U.S. Cl. .................. 252/62.9 R; 501/134; 310/211
(58) Field of Classification Search ............ 252/62.9 R; 501/134; 310/311
    See application file for complete search history.

(56) References Cited

U.S. PATENT DOCUMENTS

2006/0091588 A1    5/2006    Nakamura et al.

FOREIGN PATENT DOCUMENTS

| EP | 1 032 057 A1 | 8/2000 |
|---|---|---|
| EP | 1 457 471 A2 | 9/2004 |
| JP | 2004-363557 | 12/2004 |
| JP | 2007-204336 | * 8/2007 |

* cited by examiner

*Primary Examiner*—C. Melissa Koslow
(74) *Attorney, Agent, or Firm*—Burr & Brown

(57) ABSTRACT

There is disclosed a piezoelectric/electrostrictive body in which a polarization direction of a domain indicates reversible conversion in an electric field and a strain ratio increases, a manufacturing method of the same, and a piezoelectric/electrostrictive element. The piezoelectric/electrostrictive body includes a matrix phase represented by a composition formula $ABO_3$, and an additional, material phase included in the matrix phase, having at least a crystal structure of tetragonal system, represented by a composition formula $ABO_3$ and having a composition different from that of the matrix phase. For example, an alkali-niobate-based material of the tetragonal system, $BaTiO_3$, PZT, $PbTiO_3$, or $(Bi_{0.5}, Na_{0.5})TiO_3$ is added as an additional material forming the additional material phase to an alkali-niobate-based matrix material forming the matrix phase to form the piezoelectric/electrostrictive body. An amount of the additional material to be added has a volume ratio of 5 vol % or more and 30 vol % or less (5 vol % or more and 45 vol % or less in a case where an additional material having a composition to which Mn has been added is used) with respect to the matrix material.

20 Claims, 5 Drawing Sheets

STRAIN CURVE DURING POLARIZATION

PIEZOELECTRIC/ELECTROSTRICTIVE BODY, MANUFACTURING METHOD OF THE SAME, AND PIEZOELECTRIC/ELECTROSTRICTIVE ELEMENT

BACKGROUND OF THE INVENTION

1. Field of the Invention

The present invention relates to a piezoelectric/electrostrictive body, a manufacturing method of the same and a piezoelectric/electrostrictive element.

2. Description of the Related Art

Heretofore, a piezoelectric/electrostrictive element has been known as elements capable of controlling micro displacement on the order of submicrons. Especially, piezoelectric/electrostrictive elements which are each obtained by laminating, on a substrate made of a ceramic, a piezoelectric/electrostrictive portion formed of a piezoelectric/electrostrictive porcelain composition (hereinafter referred to simply as the "piezoelectric ceramic") and an electrode portion to which a voltage is to be applied are suitable for control of the micro displacement. In addition, the piezoelectric/electrostrictive elements have excellent properties such as high electromechanical conversion efficiency, a high-speed response, a high durability and reduced power consumption. These piezoelectric/electrostrictive elements are applicable to various fields such as a piezoelectric pressure sensor, a probe movement mechanism of a scanning type tunnel microscope, a rectilinear guide mechanism disposed in an ultra-precision processing device, a servo valve for hydraulic control, a head of a VTR device, pixels constituting a flat panel type image display device and a head of an ink jet printer.

Also with regard to the composition of the piezoelectric ceramic constituting the piezoelectric/electrostrictive portion, various investigations have been made. For example, in recent years, there has been a tendency towards minimizing influences on the global environment such as the problem of the dissolution of lead (Pb) due to acid rain. Therefore, as a piezoelectric/electrostrictive ceramic in consideration of the influences on the environment, an (LiNaK)(NbTa)O$_3$-based piezoelectric ceramic capable of providing a piezoelectric body or a piezoelectric element indicating satisfactory piezoelectric/electrostrictive properties even without containing any lead (Pb) has been developed.

The piezoelectric ceramic is a ferroelectric body, and it is incorporated in an electronic device or the like and generally subjected to a polarization treatment in order to utilize its properties (piezoelectric properties). This polarization treatment is a treatment in which a high voltage is applied to the piezoelectric ceramic to align directions of spontaneous polarizations in a specific direction. This treatment, is performed by applying the voltage to the piezoelectric ceramic under appropriate temperature conditions and the like. That is, a plurality of domains are present owing to a bias of a charge due to the spontaneous polarization, and the piezoelectric ceramic is subjected to a polarization treatment in which directions of the domains of the ferroelectric body are aligned in a constant direction for use.

In addition, the piezoelectric material (a ferroelectric material) is an aggregate of the domains, and the domains are classified into 180° domains and non-180° domains. Among the domains, the 180° domains contribute little to a strain, and the non-180° domains largely contribute to the strain. This is because the non-180° domain involves rotation of the domain which increases a volume change. Moreover, during the above-mentioned polarization treatment, the rotation of the non-180° domain occurs, and a large strain is generated.

However, the rotation of the non-180° domain, especially a 90° domain which indicates a large volume change has intense irreversibility. Therefore, once the polarization treatment in which the ceramic is retained at a high voltage is performed, the strain is reduced as compared with the strain generated during the polarization treatment. To solve the problem, a piezoelectric material in which reversibility of the domain rotation is intensified to exhibit a huge electrostrictive effect is disclosed (Patent Document 1).

[Patent Document 1] Japanese Patent Application Laid-Open No. 2004-363557

However, according to a manufacturing method of Patent Document 1, many days (five days to three months) are required for an aging treatments. Therefore, the method is inefficient, and an increase of a manufacturing cost is incurred.

SUMMARY OF THE INVENTION

An object of the present invention is to provide a piezoelectric/electrostrictive body in which reversibility of a non-180° domain is intensified to increase a strain ratio without requiring a long-time treatment such as an aging treatment, a manufacturing method of the same, and a piezoelectric/electrostrictive element.

To achieve the above object, according to the present invention, there is provided a piezoelectric/electrostrictive body comprising: a matrix phase represented by a composition formula ABO$_3$ (A is one or more elements selected from the group consisting of Li, Na and K, and B is one or more elements selected from the group consisting of Nb, Ta and Sb); and an additional material phase having at least a crystal structure of tetragonal system, represented by a composition formula ABO$_3$ (A, is one or more elements selected from the group consisting of Li, Na and K, and B is one or more elements selected from the group consisting of Nb, Ta, Sb and Mn) and having a composition different from that of the matrix phase.

More specifically, the matrix phase represented by the following composition formula can be employed:

$$\{Li_y(Na_{1-x}K_x)_{1-y}\}_a(Nb_{1-z}Ta_z)O_3,$$

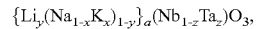

in which 0.90≦a≦1.20, 0.20≦x≦0.80, 0.02≦y≦0.20 and 0.05≦z≦0.50.

On the other hand, the additional material phase represented by the following composition formula can be employed:

$$\{Li_y(Na_{1-x}K_x)_{1-y}\}_a(Nb_{1-z}Ta_z)O_3,$$

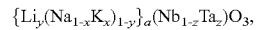

in which 0.90≦a≦1.20, 0.20≦x≦0.80, 0.02≦y≦0.20 and 0.05≦z≦0.50.

Alternatively, the additional material phase represented by the following composition formula can be employed:

$$\{Li_y(Na_{1-x}K_x)_{1-y}\}_a(Nb_{1-z-w}Ta_zMn_w)O_3,$$

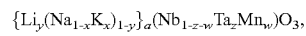

in which 0.90≦a≦1.20, 0.20≦x≦0.80, 0.02≦y≦0.20, 0.05≦z≦0.50 and 0.0001≦w≦0.03.

Moreover, to achieve the above object, according to the present invention, there is provided a piezoelectric/electrostrictive element comprising: the above-mentioned piezoelectric/electrostrictive body; and an electrode portion disposed at the piezoelectric/electrostrictive body.

Furthermore, to achieve the above object, according to the present invention, there is provided a manufacturing method of the above-mentioned piezoelectric/electrostrictive body, wherein material powder forming an additional material phase is mixed with material, powder forming a matrix phase in a volume ratio of 5 vol % or more and 30 vol % or less (5 vol. % or more and 45 vol % or less in a case where the additional material phase has a composition constituted by adding Mn to a matrix material), and is fired.

Moreover, the material powder forming the matrix phase may be mixed with the material powder forming the additional material phase and having an average particle diameter larger than that of the material powder forming the matrix phase, and fired.

Further specifically, the material powder forming the additional material phase and having an average particle diameter of 0.5 μm or more and 1.0 μm or less may be added to the material powder forming the matrix phase, and fired.

In addition, the material powder forming the additional material phase may be added to the matrix phase material powder having an average particle diameter of 0.1 μm or more and 1 μm or less, and fired.

When the matrix material forming the matrix phase and represented by the composition formula $ABO_3$ is mixed with the additional material having at least the crystal structure of the tetragonal system in constant, amounts, it is possible to increase a strain ratio in a case where a polarization treatment is performed and then an electric field is applied.

DETAILED DESCRIPTION OF THE INVENTION

An embodiment of the present invention will hereinafter be described with reference to the drawings. The present invention is not limited to the following embodiment, and may be altered, modified and improved without departing from the scope of the invention.

A "piezoelectric/electrostrictive body" mentioned in the present specification is a piezoelectric/electrostrictive material for use in forming a piezoelectric/electrostrictive portion, and exhibits specific piezoelectric properties when subjected to a polarization treatment.

Figure 4:
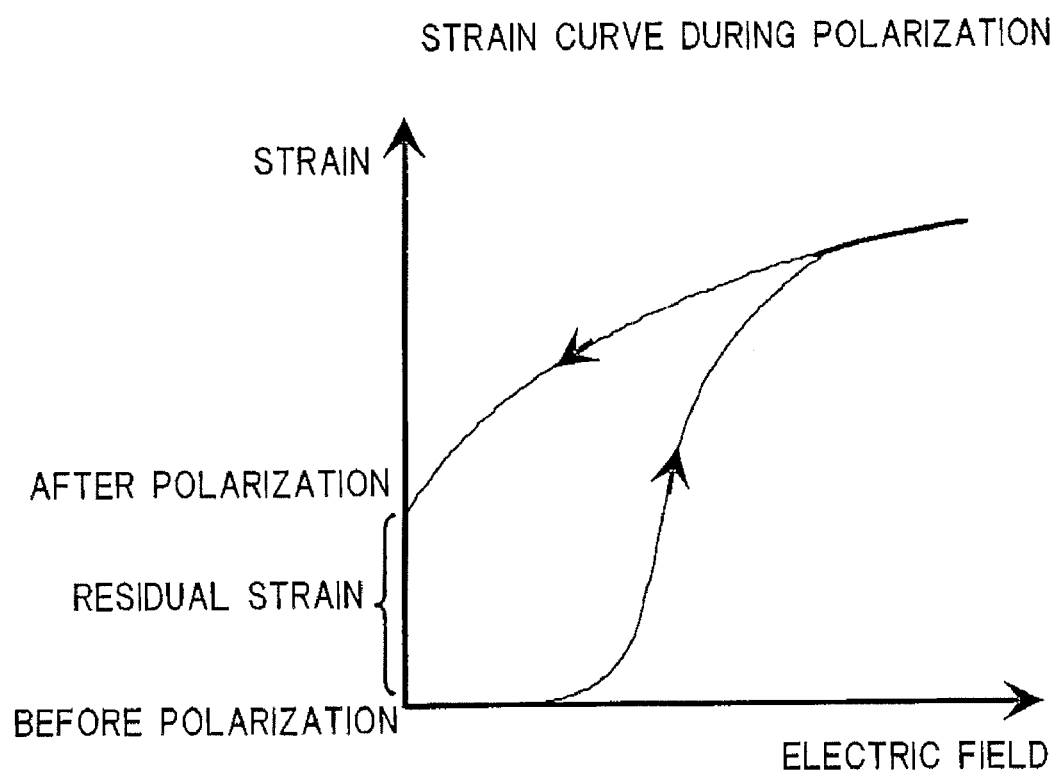
FIG. 4 is a diagram of a strain curve showing a residual strain.

The piezoelectric/electrostrictive body of the present invention is formed in a state in which a matrix material and an additional material are mixed. The piezoelectric/electrostrictive body of the present invention exhibits excellent piezoelectric properties (large strain properties), when an additional phase is formed so that a residual strain thereof is different from that of a matrix phase. Specifically, a material in which a residual strain thereof during polarization is larger than that of the matrix material may be selected as the additional material. Here, the residual strain is a strain amount after the polarization. As shown in FIG. 4, assuming that the strain amount before the polarization treatment is its origin, the residual strain is a value of the strain amount after the polarization treatment (an amount indicating a amount between lengths of a sample before and after the polarization treatment (before and after application of an electric field) in a change amount of the length per unit length). To obtain a large residual strain, an additional material having at least tetragonal system in a use temperature region may be selected. The piezoelectric/electrostrictive body of the present invention is a ceramic material in which a crystal structure of the matrix phase formed by the matrix material can reversibly perform phase transition among cubic system, tetragonal system and orthorhombic system at a phase transition temperature as a boundary. More specifically, the matrix phase is the cubic system on high temperature conditions, and the cubic system changes to the tetragonal system at a first phase transition point as the temperature drops. If the temperature further drops, the tetragonal system transits to the orthorhombic system at a second phase transition temperature as the boundary.

Moreover, the additional material phase of the present invention has at least the crystal structure of the tetragonal system in the use temperature region in which the material is utilized as the piezoelectric/electrostrictive material. That is, for example, when the user temperature region is a range of −20° C. or more and 80° C. or less, the additional material having at least the crystal structure of the tetragonal system in this range is selected. For example, when the use temperature region is a range of 50° C. or more and 150° C. or less, the additional material having at least the crystal structure of the tetragonal system in this range is selected.

That is, as in Example 1 described later, in a case where the crystal structure of the additional material phase formed by the additional material, is a ceramic material capable of reversibly performing phase transition among the cubic system, the tetragonal system and the orthorhombic system at the phase transition point as the boundary in the same manner as in the above-mentioned matrix material, the additional material having a tetragonal system-orthorhombic system phase transition temperature different from that of the matrix material may be selected. It is preferable that the tetragonal system-orthorhombic system phase transition temperature of the additional material is lower than that of the matrix material.

In addition, since the additional material phase may have a residual strain different from that of the matrix phase, the crystal structure does not have to be necessarily different from that of the matrix phase as described above. Even when the additional material phase has the same crystal structure as that of the matrix phase, the composition of the additional material phase may be different from that of the matrix phase. Specifically, a material of a composition system different from that of the matrix material may be used. For example, a composition constituted by adding Mn to the matrix material (replacing a part of the matrix material with Mn) may be used as in Example 2 described later. In any composition system, when a material having a residual strain after the polarization treatment larger than that of the matrix material is selected, an increase of a strain ratio is expected.

Furthermore, it is preferable that a micro structure of the fired additional material has crystal particles larger than those of the matrix material. That is, a bimodal structure may be formed in which the additional material having large crystal particles is dispersed in the matrix material having small crystal particles. In a case where the large crystal particles and small crystal particles having an equal volume are compared with each other, the large crystal, particles have less grain boundaries. Therefore, it is supposed that the residual strain of the additional material after the polarization is larger than that of the matrix material.

That is, the additional material phase indicates that the residual strain is different from that of the matrix phase, has at least the crystal structure of the tetragonal system in the use temperature region and is represented by a composition formula $ABO_3$ (A is one or more elements selected from the group consisting of Li, Na and K, and B is one or more elements selected from the group consisting of Nb, Ta, Sb and Mn). The additional material phase may be different from the matrix phase in at least a composition, further in the crystal structure or particle diameters.

The piezoelectric/electrostrictive portion constituting a piezoelectric/electrostrictive element described later is formed by subjecting this piezoelectric/electrostrictive body to a polarization treatment where an electric field (a voltage) is applied to the body in a region of temperatures lower than the first phase transition point at which the crystal structure of the matrix phase changes from the cubic system to the tetragonal system. The piezoelectric/electrostrictive body, and the piezoelectric/electrostrictive portion of the piezoelectric/electrostrictive element according to the present invention are formed in a state in which the additional material is included in the matrix material, and the body and the portion have the matrix phase and the additional material phase. Since the voltage is applied to the piezoelectric/electrostrictive body to perform the polarization treatment, excellent piezoelectric properties are exhibited.

In the piezoelectric/electrostrictive body of the present invention, the matrix phase has the crystal structure of the cubic system at a temperature higher than the phase transition point, and the crystal structure of the tetragonal system or the orthorhombic system in the use temperature region of temperatures lower than the phase transition point, thereby generating spontaneous polarization. Specifically, the matrix phase is the piezoelectric/electrostrictive body represented by the composition formula $ABO_3$ (A is one or more elements selected from the group consisting of Li, Na and K, and B is one or more elements selected from the group consisting of Nb, Ta and Sb). In the piezoelectric/electrostrictive body of the present invention, the matrix phase includes, as the additional material phase, a piezoelectric/electrostrictive body different from that of the matrix phase and represented by the composition formula $ABO_3$ (A is one or more elements selected from the group consisting of Li, Na and K, and B is one or more elements selected from the group consisting of Nb, Ta, Sb and Mn).

Further specifically, examples of the matrix phase include an alkali-niobate-based ferroelectric body represented by the following composition formula (1):

$$\{Li_y(Na_{1-x}K_x)_{1-y}\}_a(Nb_{1-z}Ta_z)O_3 \quad (1)$$

in which $0.90 \leq a \leq 1.20$, $0.20 \leq x \leq 0.80$, $0.02 \leq y \leq 0.20$ and $0.05 \leq z \leq 0.50$.

It is to be noted that it is preferable that a range of a of the composition formula (1) is preferably $1.00 < a \leq 1.20$, more preferably $1.00 < a \leq 1.10$.

It is to be noted that in a case where the composition of the matrix phase is represented by the above composition formula (1), a site B (a site including Nb and Ta as constituting metal elements) of this composition formula (1) may further include a transition metal element other than Nb and Ta. Examples of the transition metal element other than Nb and Ta include V, W, Cu, Ni, Co, Fe, Mn, Cr, Ti, Zr, Mo and Zn. In a case where the composition of the matrix phase is represented by the above composition formula (1), a site A (a site including Li, Na and K as constituting metal, elements) of this composition formula (1) may further include an element other than Li, Na and K. Examples of the element other than Li, Na and K include Ag, La, Ba, Ca, Sr, Pb and Bi. These elements may be contained as an oxide or the like in grains or a grain boundary.

Furthermore, in a case where the composition of the matrix phase is represented by the composition formula (1), it is preferable that this composition formula (1) further includes Sb, so that it, is possible to manufacture the piezoelectric/electrostrictive element having a larger amount of strain to be generated and exhibiting further excellent piezoelectric properties.

Moreover, examples of the additional material phase included in the matrix phase include $BaTiO_3$, PZT, $PbTiO_3$, and $(Bi_{0.5}, Na_{0.5})TiO_3\}$. Furthermore, specific examples of the additional material phase include a phase represented by the following composition formula (2):

$$\{Li_y(Na_{1-x}K_x)_{1-y}\}_a(Nb_{1-z}Ta_z)O_3 \quad (2),$$

in which $0.90 \leq a \leq 1.20$, $0.20 \leq x \leq 0.80$, $0.02 \leq y \leq 0.20$ and $0.05 \leq z \leq 0.50$.

It is to be noted that a range of a of the composition formula (2) is preferably $1.00 < a \leq 1.20$, more preferably $1.00 < a \leq 1.10$.

It is to be noted that in a case where the composition of the additional materials phase is represented by the above composition formula (2), a site B (the site including Nb and Ta as the constituting metal elements) of this composition formula (2) may further include a transition metal element other than Nb and Ta in the same manner as in the matrix phase. Examples of the transition metal element other than Nb and Ta include V, W, Cu, Ni, Co, Fe, Cr, Ti, Zr, Mo and Zn. In a case where the composition of the additional material phase is represented by the above composition formula (2), a site A (the site including Li, Na and K as the constituting metal elements) of this composition formula (2) may further include an element other than Li, Na and K. Examples of the element other than Li, Na and K include Ag, La, Ba, Ca, Sr, Pb and Bi. These elements may be contained as the oxide or the like in the grains or the grain boundary. However, as described above, to increase rate of strain (a attain amount), the additional material phase may choose a composition different from that of the matrix phase, and the composition should have at least the crystal structure of the tetragonal system in the use temperature region in which the composition is used as the piezoelectric/electrostrictive element. An optimum amount of the additional material to be added is 5 vol % or more and 30 vol % or less in terms of a volume ratio. It is to be noted that in the present, specification, the volume ratio of the additional material is a percentage of the additional material occupied in the volume of the piezoelectric/electrostrictive body in which the matrix material, and the additional material are mixed (e.g., when the ratio of the additional material is 5 vol %, the ratio of the matrix material is 95 vol %).

Furthermore, examples of the additional material phase included in the matrix phase represented by the formula (1) include a phase represented by the following composition formula (3):

$$\{Li_y(Na_{1-x}K_x)_{1-y}\}_a(Nb_{1-z-w}Ta_zMn_w)O_3 \quad (3),$$

in which $0.90 \leq a \leq 1.20$, $0.20 \leq x \leq 0.80$, $0.02 \leq y \leq 0.20$, $0.05 \leq z \leq 0.50$ and $0.0001 \leq w \leq 0.03$.

It is to be noted that in a case where the composition of the additional, material, phase is represented by the above composition formula (3), a site B (the site including Nb and Ta as the constituting metal elements) of this composition, formula (3) may further include a transition metal element other than Nb and Ta in the same manner as in the matrix phase. Examples of the transition metal element other than Nb and Ta include not only Mn of the above composition formula (3) but also V, W, Cu, Ni, Co, Fe, Cr, Ti, Zr, Mo and Zn. In a case where the composition of the additional material phase is represented by the above composition formula (3), a site A (the site including Li, Na and K as the constituting metal elements) of this composition formula (3) may further include an element other than Li, Na and K. Examples of the element other than Li, Na and K include Ag, La, Ba, Ca, Sr, Pb and Bi. These elements may be contained as the oxide or the like in the grains or the grain boundary. However, as described above, to increase rate of strain (a strain amount), the additional material phase may choose a composition having at least the crystal stricture of the tetragonal system in the use temperature region in which the composition is utilized as the piezoelectric/electrostrictive element.

In a case where the additional material having the composition to which Mn has been added is used, the optimum amount of the additional material to be added is 5 vol % or more and 45 vol % or less, preferably 20 vol. % or more and 45 volt or less, more preferably 35 vol % or more and 45 vol. % or less in terms of the volume ratio.

To manufacture the piezoelectric/electrostrictive body for use in forming the piezoelectric/electrostrictive portion of the piezoelectric/electrostrictive element, first the matrix material powder and the additional material powder are individually manufactured. To satisfy percentages (mol ratios) of the metal, elements of the composition of the material powder, a compound containing the respective metal elements is weighed, and mixed with a solvent such as ethanol by a mixing method such as ball milling to obtain a mixed slurry. It is to be noted that there is not, any special restriction on a type of the compound containing the metal elements, but the oxide of the metal elements, carbonate thereof or the like is preferably used. For example, lithium carbonate, potassium tartrate, sodium tartrate, niobium oxide, tantalum oxide or the like may be used.

When the resultant mixed slurry is dried using a drier or an operation such as filtering, a mixed additional material can be obtained. The resultant mixed additional material is calcined, and pulverized if necessary. The matrix material powder and the additional material powder are both individually manufactured.

It is preferable that the above described calcined and pulverized additional material powder and the matrix material powder each have an average particle diameter of 0.1 μm or more and 1 μm or less. Here, it is assumed that the average particle diameter is a 50% diameter (a median diameter) in a cumulative distribution.

Accordingly, the calcined and pulverized additional material powder described above is then fired and subjected to grain growth at 1000° C. or more, and is then pulverized again to now set the average particle diameter to 0.5 μm or more and 10 μm or less with a classifier. As such, when the average particle diameter of the additional material powder is set to be larger than 10 μm, strain properties largely fluctuate, and it is difficult to obtain stable strain properties.

Further, when the average particle diameter of the additional material powder is set to be smaller than 0.5 μm, a large effect of increasing the strain ratio is also not easily obtained. This is because the powder having excessively small grain diameters reacts with (dissolves in) the matrix material to form a homogeneous piezoelectric/electrostrictive body (a homogeneous crystal phase or composition). When the fired additional material has excessively small crystal grain diameters, the powder has domain walls in only one direction. Therefore, anisotropy is generated in the strain of the additional material during the polarization treatment. As a result, it is supposed that an inhomogeneous residual stress is present in an applied electric field direction. In other words, it is preferable that the piezoelectric/electrostrictive body has a composite structure in which the additional material phase is different from the crystal phase of the matrix material that is present. It is also preferable that the additional material has crystal grain diameters to such an extent that the powder has the domain walls in a plurality of directions. In a case where the additional material powder having the domain walls in the only one direction is used, it is preferable to orient the powder and add the powder to the matrix material particles so that the residual stress is present in a similar uniform direction. It is preferable that the final average particle diameter of the subsequently prepared additional material powder is larger than that of the matrix material powder.

The additional material powder is added to the matrix material, powder in a range of 5 vol % or more and 30 vol % or less (5 vol % or more and 45 vol % or less in a case where the additional material phase has a composition in which Mn has been added to the matrix material), and dry-mixed using a ball, mill. After forming the resultant mixed powder, a formed body is fired at a temperature of 950 to 1200° C. to increase the average particle diameter of the matrix material (the matrix phase) to 0.5 μm to 15 μm, and the piezoelectric/electrostrictive body can be obtained. It is to be noted that the material powder may be calcined at a temperature of about 600 to 1000° C. Moreover, the pulverization may be performed by a method such as ball milling. Subsequently, after processing the resultant piezoelectric/electrostrictive body into an appropriate shape (e.g., a square-plate-like shape) if necessary, the body is thermally treated at a temperature of about 400 to 900° C. for one hour or more. Subsequently, the piezoelectric/electrostrictive body is subjected to a polarization treatment and used as it is. The polarization treatment is performed by applying a voltage of about 5 kV/mm to the piezoelectric/electrostrictive body for 15 minutes or more.

It is to be noted that the piezoelectric/electrostrictive portion and an electrode constituting the piezoelectric/electrostrictive element of the present embodiment can be formed into various shapes. Specifically, preferable examples of the shape include a block-like shape (so-called a bulk body) and a sheet-like (film-like) shape.

As described above, the piezoelectric/electrostrictive body represented by the composition formula $ABO_3$ is used as the matrix material, and the piezoelectric/electrostrictive body having at least the crystal structure of the tetragonal system in the use temperature region and represented by the composition formula $ABO_3$ is added as the additional material to manufacture the piezoelectric/electrostrictive body. In consequence, the strain ratio of the piezoelectric/electrostrictive body can be increased.

Figure 1:
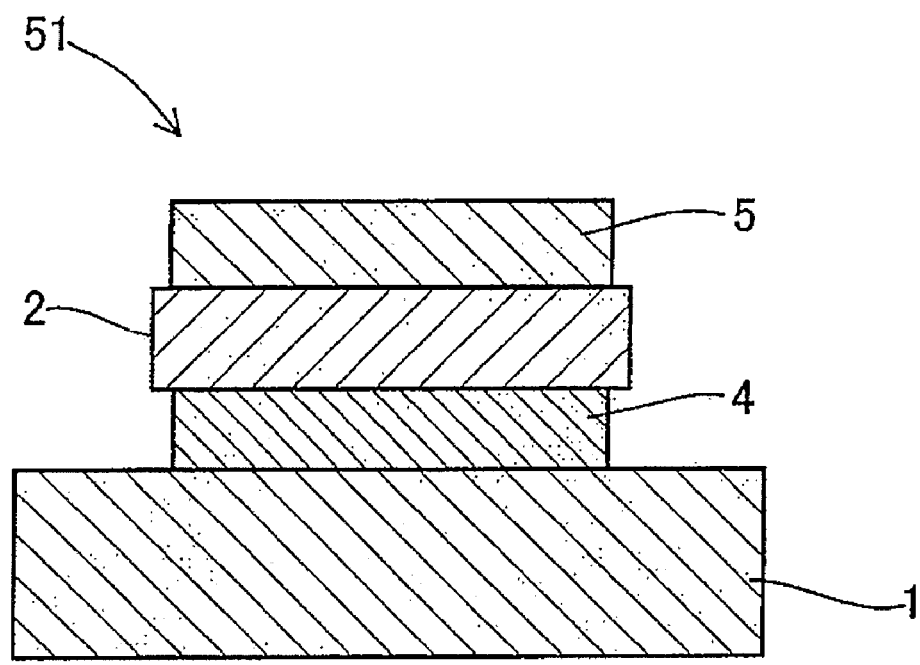
FIG. 1, is a sectional view schematically showing one embodiment of a piezoelectric/electrostrictive element according to the present invention.

Subsequently, an embodiment in which a piezoelectric/electrostrictive portion is formed into a film-like shape is shown in FIG. 1. As shown in FIG. 1, a piezoelectric/electrostrictive element 51 of the present embodiment includes a substrate 1 made of a ceramic, a film-like piezoelectric/electrostrictive portion 2 and film-like electrodes 4, 5 electrically connected to this piezoelectric/electrostrictive portion 2. The piezoelectric/electrostrictive portion 2 is secured onto the substrate 1 in a state in which the electrode 4 is interposed between the piezoelectric/electrostrictive portion and the substrate. It is to be noted that the piezoelectric/electrostrictive portion may be directly secured to the substrate without interposing any electrode. It is to be noted that "secured" as mentioned in the present specification indicates that the first piezoelectric portion 2 is tightly integrated with the substrate 1 or the electrode 4 owing to a solid-phase reaction therebetween without using any organic or inorganic adhesive.

In the piezoelectric/electrostrictive element 51 of the present embodiment (see FIG. 1), a thickness of the piezoelectric/electrostrictive portion 2 is preferably 0.5 to 50 μm, further preferably 0.8 to 40 μm, especially preferably 1.0 to 30 μm. If the thickness of the piezoelectric/electrostrictive portion 2 is less than 0.5 μm, densification of the piezoelectric/electrostrictive portion becomes insufficient in some case. On the other hand, if the thickness of the piezoelectric/electrostrictive portion 2 exceeds 50 μm, a contractive stress of a piezoelectric/electrostrictive body during firing increases. The substrate 1 needs to be thickened in order to prevent the substrate 1 from being collapsed. It is sometimes difficult to cope with miniaturization of the element. It is to be noted that the piezoelectric/electrostrictive element 51 may be constituted as a so-called multilayered type.

The substrate 1 constituting the piezoelectric/electrostrictive element 51 of the embodiment according to the present invention is made of the ceramic, but there is not any special restriction on a type of this ceramic. However, in respect of heat resistance, chemical stability and insulating property, it is preferable that the ceramic includes at least one selected from the group consisting of stabilized zirconium oxide, aluminum oxide, magnesium oxide, mullite, aluminum nitride, silicon nitride and glass.

It is to be noted that a thickness of the substrate is preferably 1 μm to 1 mm, further preferably 1.5 to 500 μm, especially preferably 2 to 200 μm. If the thickness of the substrate is less than 1 μm, a mechanical strength of the piezoelectric/electrostrictive element sometimes drops. On the other hand, if the thickness exceeds 1 mm and an electric field is applied to the piezoelectric/electrostrictive portion, rigidity of the substrate increases with respect to the generated contractive stress, and flexural displacement of the piezoelectric/electrostrictive portion is sometimes reduced.

In the piezoelectric/electrostrictive element of the present embodiment, the electrode is electrically connected to the piezoelectric/electrostrictive portion, and disposed between the piezoelectric/electrostrictive portions. A material of the electrode may be at least one metal selected from the group consisting of Pt, Pd, Rh, Au, Ag and an alloy of these metals. Above all, platinum or an alloy containing platinum as a main component is preferable because the heat resistance thereof during the firing of the piezoelectric/electrostrictive portion is high. Since the piezoelectric/electrostrictive portion can be formed at a lower firing temperature, an alloy such as Ag—Pd may preferably be used.

EXAMPLES

The present invention will hereinafter be described in more detail based on examples, but the present invention is not limited to these examples. A measurement method of various physical values and an evaluation method of properties will hereinafter be described.

[Strain Ratio (Electrically Induced Strain)]: A strain gauge was attached to an electrode, a voltage of 4 kV/mm was applied to the electrode, and then a strain amount in a direction vertical to an electric field was measured as a strain ratio (an electrically induced strain).

Example 1

Predetermined amounts of lithium carbonate ($Li_2CO_3$), sodium tartrate ($C_4H_5O_6Na.H_2O$), potassium tartrate ($C_4H_5O_6K$), niobium oxide ($Nb_2O_5$) and tantalum oxide ($Ta_2O_5$) were mixed in ethanol (ethyl alcohol) for 16 hours to prepare a mixture. After drying the resultant mixture, the mixture was calcined at 800° C. Subsequently, the mixture was similarly pulverized and calcined again using a ball mill. The coarsely pulverized mixture was passed through a sieve of 500 meshes to regulate particle sizes. At this time, an average particle diameter of material powder of a matrix material was set to 0.4 to 0.5 μm, and an average particle diameter of material powder of an additional material was set to 0.4 to 0.5 μm. Moreover, the material powder of the additional material was subjected to grain growth at a temperature of 1050° C., and then coarsely pulverized, and the average particle diameter thereof was set to 1 to 2 μm by use of a classifier.

The material powder of the matrix material was thus formed so as to be represented by a composition formula $\{Li_{0.06}(Na_{0.55}K_{0.45})_{0.94}\}_{1.011}(Nb_{0.918}Ta_{0.082})O_3$. This is a composition in the vicinity of a phase boundary between orthorhombic system and tetragonal system at room temperature, and a displacement amount after polarization is as large as compared with a single phase (complete orthorhombic system or complete tetragonal system).

Moreover, the material powder of the additional material was formed so as to be represented by a composition formula $\{Li_{0.08}(Na_{0.55}K_{0.45})_{0.92}\}_{1.011}(Nb_{0.918}Ta_{0.082})O_3$. This is complete tetragonal system at room temperature.

The matrix material indicated a residual strain of approximately 50 to 150 ppm, whereas the additional material indicated a residual strain of approximately 150 to 250 ppm, and the residual strain of the additional material was larger than that of the matrix material.

Moreover, the material powder of the additional material was added to the material powder of the matrix material in a range of 2 to 40 vol. %, and dry mixing was performed. The resultant mixed powder was compacted under a pressure of 2 $t/cm^2$ to form a circular plate having a diameter of 15 mm and a thickness of about 10 mm. The resultant powder compact was fired at a temperature of 1000 to 1100° C. for three hours to obtain a fired body (a piezoelectric/electrostrictive body). The resultant sintered body was processed into a size of 12 mm×3 mm×1 mm.

The processed sintered body was thermally treated at 900° C. for one hour, and opposite surfaces of the body were then subjected to a sputtering process by use of Au to prepare electrodes. Afterward, this body was submerged into silicon oil at room temperature. Moreover, a direct-current electric field of 5 kV/mm was applied between the electrodes for 15 minutes to perform a polarization treatment.

Figure 2:
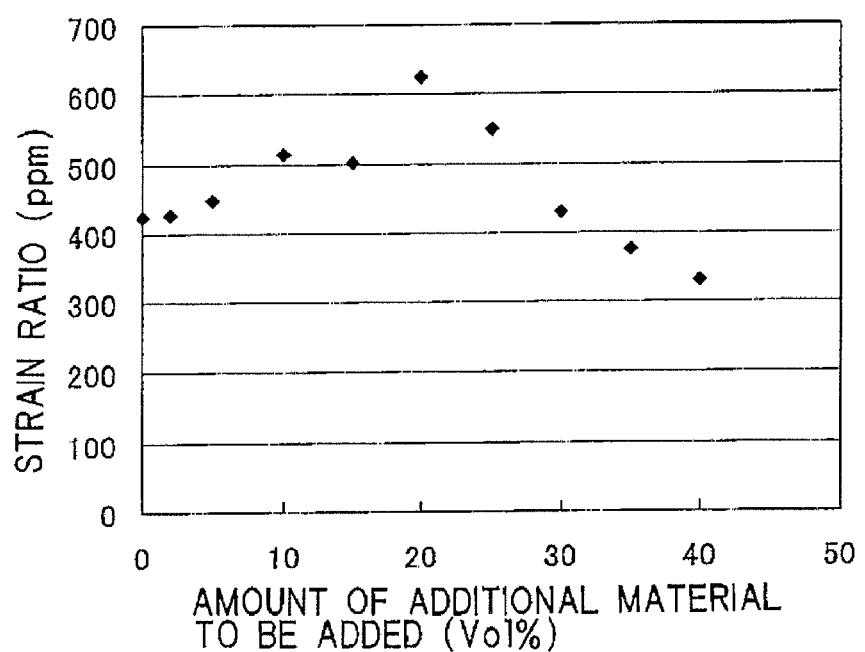
FIG. 2 is a diagram showing a relation between an amount of an additional material to be added and a strain ratio according to Example 1.

A strain gauge was attached to one surface of the resultant piezoelectric/electrostrictive element with an adhesive, an electric field up to 4 kV/mm was applied, and a strain ratio of a sample was measured. The strain ratio during the application of 4 kV/mm to the sample is shown in Table 1 and FIG. 2.

TABLE 1

| Sample (Example 1) | |
|---|---|
| Added amount (Vol %) | Strain ratio (ppm) |
| 0 | 425 |
| 2 | 428 |
| 5 | 448 |

TABLE 1-continued

Sample (Example 1)

| Added amount (Vol %) | Strain ratio (ppm) |
|---|---|
| 10 | 513 |
| 15 | 502 |
| 20 | 626 |
| 25 | 551 |
| 30 | 430 |
| 35 | 376 |
| 40 | 330 |

Comparative Example 1

Predetermined amounts of lithium carbonate ($Li_2CO_3$), sodium tartrate ($C_4H_5O_6Na \cdot H_2O$), potassium tartrate ($C_4H_5O_6K$), niobium oxide ($Nb_2O_5$) and tantalum oxide ($Ta_2O_5$) were mixed in ethanol (ethyl alcohol) for 16 hours to prepare a mixture. After drying the resultant mixture, the mixture was calcined at 800° C. Subsequently, the mixture was similarly pulverized and calcined again using a ball mill. The coarsely pulverized mixture was passed through a sieve of 500 meshes to regulate particle sizes. At this time, an average particle diameter of material powder of a matrix material was set to 0.4 to 0.5 μm, and an average particle diameter of material powder of an additional material was set to 0.4 to 0.5 μm.

Afterward, in the comparative example, unlike the example, steps of grain growth, coarse pulverization and grain size regulation of the material powder of the additional material were not performed. That is, the comparative example is an example in which the material powder of the additional material was not enlarged.

The material powder of the matrix material was thus formed so as to be represented by a composition formula $\{Li_{0.06}(Na_{0.55}K_{0.45})_{0.94}\}_{1.011}(Nb_{0.918}Ta_{0.082})O_3$. This is a composition in the vicinity of a phase boundary between orthorhombic system and tetragonal system at room temperature, and a displacement amount after polarization is large as compared with a single phase (complete orthorhombic system or complete tetragonal system).

Moreover, the material powder of the additional material was formed so as to be represented by a composition formula $\{Li_{0.08}(Na_{0.55}K_{0.45})_{0.92}\}_{1.011}(Nb_{0.918}Ta_{0.082})O_3$. This is complete tetragonal system at room temperature.

Furthermore, the material powder of the additional material was added to the material powder of the matrix material in a range of 2 to 40 vol. %, and dry mixing was performed. The resultant mixed powder was compacted under a pressure of 2 t/cm² to form a circular plate having a diameter of 15 mm and a thickness of about 10 mm. The resultant powder compact was fired at a temperature of 1000 to 1100° C. for three hours to obtain a fired body (a piezoelectric/electrostrictive body). The resultant sintered body was processed into a size of 12 mm×3 mm×1 mm.

The processed sintered body was thermally treated at 900° C. for one hour, and opposite surfaces of the body were then subjected to a sputtering process by use of Au to prepare electrodes. Afterward, this body was submerged into silicon oil at room temperature. Moreover, a direct-current electric field of 5 kV/mm was applied between the electrodes for 15 minutes to perform a polarization treatment.

Figure 3:
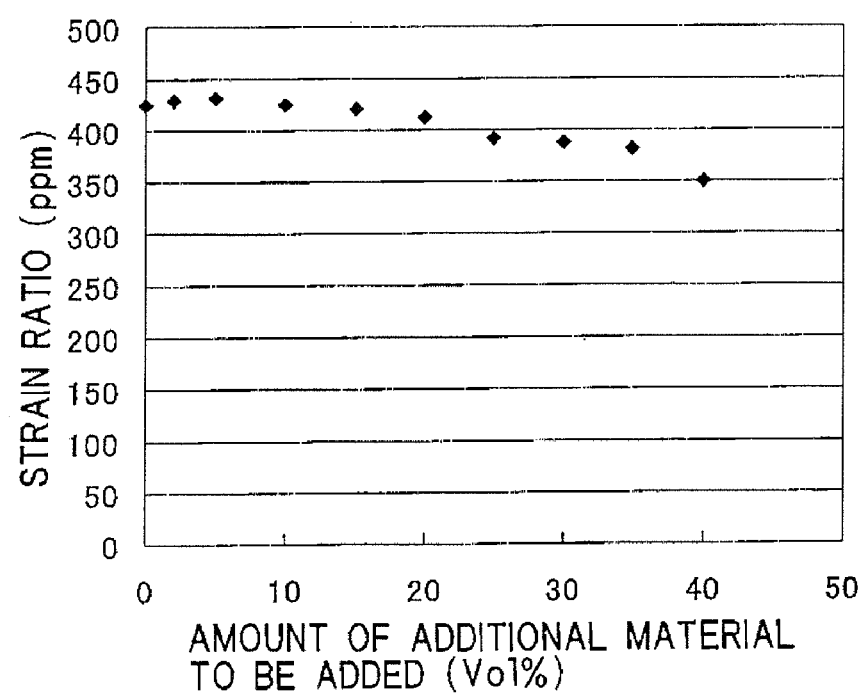
FIG. 3 is a diagram showing a relation between an amount of an additional material to be added and a strain ratio according to Comparative Example 1.

A strain gauge was attached to one surface of the resultant piezoelectric/electrostrictive element with an adhesive, an electric field up to 4 kV/mm was applied, and a strain ratio of a sample was measured. The strain ratio during the application of 4 kV/mm to the sample is shown in Table 2 and FIG. 3.

TABLE 2

Sample (Comparative Example 1)

| Added amount (Vol %) | Strain ratio (ppm) |
|---|---|
| 0 | 425 |
| 2 | 430 |
| 5 | 431 |
| 10 | 425 |
| 15 | 421 |
| 20 | 412 |
| 25 | 392 |
| 30 | 387 |
| 35 | 381 |
| 40 | 350 |

In Comparative Example 1 in which the additional material powder was not enlarged and an average particle diameter thereof was set to be substantially equal to that of the matrix material powder to form homogeneous crystals, improvement of the strain ratio was not seen.

Example 2

In the same manner as in Example 1, material, powder of a matrix material and material powder of an additional material were prepared by a general solid phase process. As starting materials, lithium carbonate ($Li_2CO_3$), sodium tartrate ($C_4H_5O_6Na \cdot H_2O$), potassium tartrate ($C_4H_5O_6K$), niobium oxide ($Nb_2O_5$), tantalum oxide ($Ta_2O_5$) and manganese carbonate ($MnCO_3$) were weighed so as to obtain respective compositions. The materials were mixed in alcohol for 16 hours by use of a ball mill to prepare a mixture. After drying the resultant mixture, the mixture was calcined at a temperature of 800° C. Subsequently, the mixture was pulverized and calcined again. Particle sizes of the coarsely pulverized mixture were regulated. At this time, an average particle diameter of the material powder of the matrix material was set to 0.4 to 0.5 μl, and an average particle diameter of the material powder of the additional material was set to 0.4 to 0.5 μm. The material powder of the additional material was subjected to grain growth at a temperature of 1000° C., and then coarsely pulverized, and the average particle diameter thereof was set to 1 to 2 μm by use of a classifier.

The material powder of the matrix material was thus formed so as to be represented by a composition formula $\{Li_{0.060}(Na_{0.55}K_{0.45})_{0.94}\}_{1.011}(Nb_{0.918}Ta_{0.082})O_3$ by use of a alkali-niobate-based ferroelectric body.

Moreover, the material powder of the additional material was formed so as to be represented by a composition formula $\{Li_{0.060}(Na_{0.55}K_{0.45})_{0.92}\}_{1.011}(Nb_{0.916}Ta_{0.082}Mn_{0.002})O_3$ (Nb of the matrix material was replaced with Mn).

The matrix material indicated a residual strain of approximately 50 to 150 ppm, whereas the additional material indicated a residual strain of approximately 500 to 600 ppm, and the residual strain of the additional material was larger than that of the matrix material.

Moreover, the material powder of the additional material was added to the material powder of the matrix material in a range of 10 to 50 vol %, and dry mixing was performed, thereby forming a circular plate having a diameter of 15 mm and a thickness of about 10 mm. The resultant formed body was fired at a temperature of 950 to 1030° C. The resultant sintered body was processed into a size of 1.2 mm×3 mm×1 mm.

(Evaluation Method)

Furthermore, opposite surfaces of the processed sintered body were subjected to a sputtering process by use of Au, and a voltage of 5 kV/mm was applied to the body for 15 minutes to perform a polarization treatment. Afterward, a strain gauge was attached to one surface of the resultant body with an adhesive, an voltage of 4 kV/mm was applied, and a strain ratio (ppm) was measured. A residual strain was obtained by measuring a strain of a non-polarized sample.

Comparative Example 2

Figure 5:
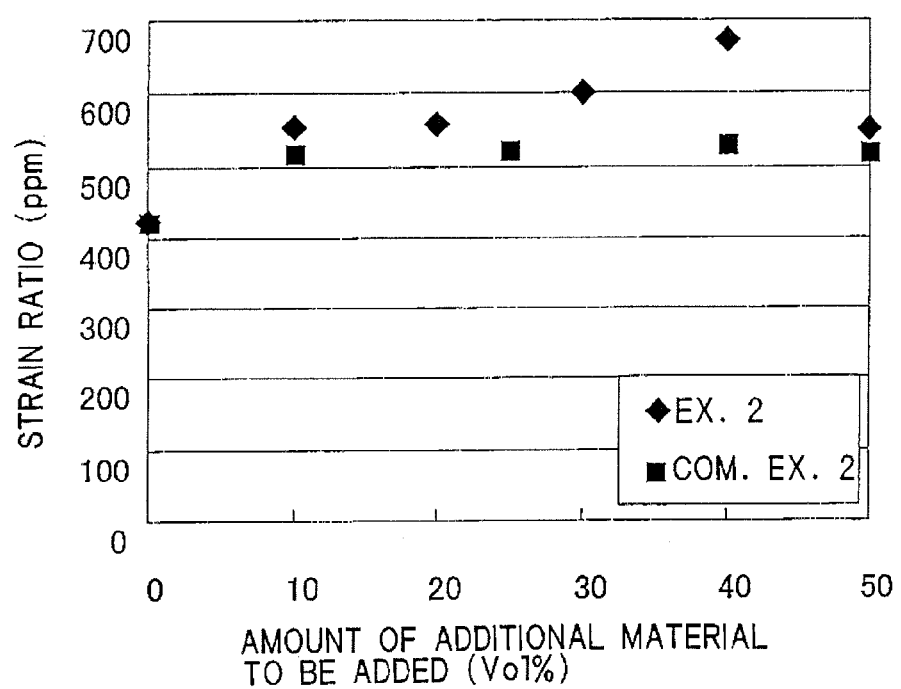
FIG. 5 is a diagram showing a relation between an amount of an additional material to be added and a strain ratio according to Example 2 and Comparative Example 2.

In Comparative Example 2, a sample was prepared in the same manner as in Example 2. However, an average particle diameter of material powder of an additional material was set to 0.4 to 0.5 µm, and the powder was mixed. Strain ratios of the samples of Example 2 and Comparative Example 2 at a time of application of 4 kV/mm to the samples are shown in Table 3 and FIG. 5.

TABLE 3

|                      | Strain ratio (ppm) |                       |
|----------------------|--------------------|-----------------------|
| Added amount (Vol %) | Example 2          | Comparative Example 2 |
| 0                    | 425                | 425                   |
| 10                   | 555                | 520                   |
| 20                   | 557                |                       |
| 25                   |                    | 523                   |
| 30                   | 600                |                       |
| 40                   | 672                | 530                   |
| 50                   | 550                | 517                   |

In Example 2 in which the piezoelectric/electrostrictive body including the additional material having a composition different from that of a matrix phase (the additional material had the same crystal structure as that of the matrix material) was obtained, a large strain ratio was indicated as compared with Comparative Example 2 in which a homogeneous composition was obtained. Furthermore, when the additional material was mixed in a ratio of 40 vol. %, the strain ratio increased.

As described above, in a case where the piezoelectric/electrostrictive body including the matrix phase and the additional material phase having at least the crystal structure of the tetragonal system is obtained, the strain ratio increases. Especially, the additional material may be constituted in a volume ratio of 5 vol % or more and 30 vol % or less (5 vol % or more and 45 vol. % or less in a case where the additional material having a composition to which Mn has been added is used) with respect to the matrix material. In Comparative Examples 1 and 2 in which the average particle diameter of the material powder of the additional material was set to be approximately at the same level as that of the material powder of the matrix material, the strain ratio increased less than in Examples 1 and 2. A predicted reason for the increase of the strain ratio will hereinafter be described.

When a non-180° domain of crystals is noted, domains other than a 90° domain, for example, a 60° domain and a 120° domain are present in the matrix material having the composition in the vicinity of a phase boundary between the orthorhombic system and the tetragonal system. The average particle diameter of the material powder of the additional material is set to be approximately at the same level as that of the material powder of the matrix material, the powder is mixed, and the resultant homogeneous sintered body (the sintered body which does not have the matrix phase and the additional material phase) is subjected to the polarization treatment (the electric field is applied). In this case, the domains contract vertically to a direction of the applied electric field, and expand horizontally. When the electric field is removed, the 60° domain and the 120° domain return to original positions owing to intense reversibility. However, the 90° domain which indicates the largest volume change has weak reversibility (intense irreversibility) and does not return to an original position thereof. On the other hand, when the sintered body including the additional material phase having a large residual strain and having at least the crystal structure of the tetragonal system is subjected to the polarization treatment, since the residual strain of the additional material is larger than that of the matrix phase, a residual tensile stress remains vertically to the direction of the applied electric field in the matrix phase, and a residual compressive stress remains horizontally. The 90° domain present in the matrix phase returns owing to this residual stress. That is, it is supposed that since the reversible domains increase, the strain amount would increase.

To increase the residual stress, it, is preferable to select the additional material having a large residual strain (the additional material having at least the tetragonal system having many 90° domain having the intense irreversibility). When an amount of the additional, material to be mixed is smaller than 5 vol %, the 90° domain of the matrix material does not become reversible owing to a small residual stress, and the strain amount scarcely changes. However, if the mixed amount is in excess of 30 vol % (45 vol % in a case where the additional material having the composition to which Mn has been added is used), it is supposed that influences of the additional material having the intensely irreversible 90° domain increase and that the strain ratio decreases (as compared with the homogeneous sintered body).

Moreover, to allow the additional material to be present as the additional material phase in the matrix phase without reacting with (dissolving in) the matrix phase, the beforehand coarsely pulverized material powder of the additional material may be mixed with the material powder of the matrix material. In this case, it is preferable that the average particle diameter of the material powder of the additional material is 0.5 µm or more and 10 µm or less. In a case where the average particle diameter of the material powder of the matrix material is set to be approximately at the same level as that of the material powder of the additional material and the powder is mixed and sintered, the powder is sintered using a hot press process, a spark plasma sintering (SPS) process or the like while suppressing the grain growth infinitely. In consequence, the piezoelectric/electrostrictive body including the matrix phase and the additional material phase having at least the crystal structure of the tetragonal, system can be obtained.

A piezoelectric/electrostrictive body and a piezoelectric/electrostrictive element of the present invention exhibit excellent piezoelectric/electrostrictive properties, and are suitable for an actuator, a sensor and the like.

What is claimed is:
1. A piezoelectric/electrostrictive body comprising:
   a matrix phase represented by a composition formula $ABO_3$ (A is one or more elements selected from the group consisting of Li, Na and K, and B is one or more elements selected from the group consisting of Nb, Ta and Sb); and
   an additional material phase having at least a crystal structure of tetragonal system, represented by a composition formula $ABO_3$ (A is one or more elements selected from the group consisting of Li, Na and K, and B is one or more elements selected from the group consisting of Nb, Ta, Sb and Mn) and having a composition different from that of the matrix phase,
wherein the additional material phase has a phase transition temperature that is different than a phase transition temperature of the matrix phase.

2. The piezoelectric/electrostrictive body according to claim 1, wherein the matrix phase is represented by the following composition formula:

$$\{Li_y(Na_{1-x}K_x)_{1-y}\}_a(Nb_{1-z}Ta_z)O_3,$$

in which $0.90 \leq a \leq 1.20$, $0.20 \leq x \leq 0.80$, $0.02 \leq y \leq 0.20$ and $0.05 \leq z \leq 0.50$.

3. The piezoelectric/electrostrictive body according to claim 1, wherein the additional material phase is represented by the following composition formula:

$$\{Li_y(Na_{1-x}K_x)_{1-y}\}_a(Nb_{1-z}Ta_z)O_3,$$

in which $0.90 \leq a \leq 1.20$, $0.20 \leq x \leq 0.80$, $0.02 \leq y \leq 0.20$ and $0.05 \leq z \leq 0.50$.

4. The piezoelectric/electrostrictive body according to claim 2, wherein the additional material phase is represented by the following composition formula:

$$\{Li_y(Na_{1-x}K_x)_{1-y}\}_a(Nb_{1-z}Ta_z)O_3,$$

which $0.90 \leq a \leq 1.20$, $0.20 \leq x \leq 0.80$, $0.02 \leq y \leq 0.20$ and $0.05 \leq z \leq 0.50$.

5. The piezoelectric/electrostrictive body according to claim 1, wherein the additional material phase is represented by the following composition formula:

$$\{Li_y(Na_{1-x}K_x)_{1-y}\}_a(Nb_{1-z-w}Ta_zMn_w)O_3,$$

in which $0.90 \leq a \leq 1.20$, $0.20 \leq x \leq 0.80$, $0.02 \leq y \leq 0.20$, $0.05 \leq z \leq 0.50$ and $0.0001 \leq w \leq 0.03$.

6. The piezoelectric/electrostrictive body according to claim 2, wherein the additional material phase is represented by the following composition formula:

$$\{Li_y(Na_{1-x}K_x)_{1-y}\}_a(Nb_{1-z-w}Ta_zMn_w)O_3,$$

in which $0.90 \leq a \leq 1.20$, $0.20 \leq x \leq 0.80$, $0.02 \leq y \leq 0.20$, $0.05 \leq z \leq 0.50$ and $0.0001 \leq w \leq 0.03$.

7. A piezoelectric/electrostrictive element comprising:
the piezoelectric/electrostrictive body according to claim 1; and
an electrode portion disposed at the piezoelectric/electrostrictive body.

8. A piezoelectric/electrostrictive element comprising:
the piezoelectric/electrostrictive body according to claim 4; and
an electrode portion disposed at the piezoelectric/electrostrictive body.

9. A manufacturing method of the piezoelectric/electrostrictive body according to claim 3, wherein material powder forming an additional material phase is mixed with material powder forming a matrix phase in a volume ratio of 5 vol % or more and 30 vol % or less, and is fired.

10. A manufacturing method of the piezoelectric/electrostrictive body according to claim 4, wherein material powder forming an additional material phase is mixed with material powder forming a matrix phase in a volume ratio of 5 vol % or more and 30 vol % or less, and is fired.

11. A manufacturing method of the piezoelectric/electrostrictive body according to claim 5, wherein material powder forming an additional material phase is mixed with material powder forming a matrix phase in a volume ratio of 5 vol % or more and 45 vol % or less, and is fired.

12. A manufacturing method of the piezoelectric/electrostrictive body according to claim 6, wherein material powder forming an additional material phase is mixed with material powder forming a matrix phase in a volume ratio of 5 vol % or more and 45 vol % or less, and is fired.

13. The manufacturing method of the piezoelectric/electrostrictive body according to claim 9, wherein the material powder forming the matrix phase is mixed with the material powder forming the additional material phase and having an average particle diameter larger than that of the material powder forming the matrix phase, and is fired.

14. The manufacturing method of the piezoelectric/electrostrictive body according to claim 10, wherein the material powder forming the matrix phase is mixed with the material powder forming the additional material phase and having an average particle diameter larger than that of the material powder forming the matrix phase, and is fired.

15. The manufacturing method of the piezoelectric/electrostrictive body according to claim 11, wherein the material powder forming the matrix phase is mixed with the material powder forming the additional material phase and having an average particle diameter larger than that of the material powder forming the matrix phase, and is fired.

16. The manufacturing method of the piezoelectric/electrostrictive body according to claim 12, wherein the material powder forming the matrix phase is mixed with the material powder forming the additional material phase and having an average particle diameter larger than that of the material powder forming the matrix phase, and is fired.

17. The manufacturing method of the piezoelectric/electrostrictive body according to claim 9, wherein the material powder forming the additional material phase and having an average particle diameter of 0.5 μm or more and 10 μm or less is added to the material powder forming the matrix phase, and is fired.

18. The manufacturing method of the piezoelectric/electrostrictive body according to claim 11, wherein the material powder forming the additional material phase and having an average particle diameter of 0.5 μm or more and 10 μm or less is added to the material powder forming the matrix phase, and is fired.

19. The manufacturing method of the piezoelectric/electrostrictive body according to claim 9, wherein the material powder forming the additional material phase is added to the material powder forming the matrix phase, and wherein the matrix phase particles have an average particle diameter of 0.1 μm or more and 1 μm or less, and is fired.

20. The manufacturing method of the piezoelectric/electrostrictive body according to claim 11, wherein the material powder forming the additional material phase is added to the material powder forming the matrix phase, and wherein the matrix phase particles have an average particle diameter of 0.1 μm or more and 0.1 μm or less, and is fired.

* * * * *

UNITED STATES PATENT AND TRADEMARK OFFICE
CERTIFICATE OF CORRECTION

PATENT NO. : 7,803,282 B2  
APPLICATION NO. : 11/844560  
DATED : September 28, 2010  
INVENTOR(S) : Yamaguchi et al.

Page 1 of 1

It is certified that error appears in the above-identified patent and that said Letters Patent is hereby corrected as shown below:

Column 15

*Line 23*: please add --in-- before "which"

Signed and Sealed this
Eighth Day of March, 2011

David J. Kappos
*Director of the United States Patent and Trademark Office*